(12) United States Patent
Davies

(10) Patent No.: US 8,170,508 B2
(45) Date of Patent: May 1, 2012

(54) PRE-DISTORTION FOR A RADIO FREQUENCY POWER AMPLIFIER

(75) Inventor: Dorian Davies, Bishop's Stortford (GB)

(73) Assignee: Rockstar Bidco LP, New York, NY (US)

( * ) Notice: Subject to any disclaimer, the term of this patent is extended or adjusted under 35 U.S.C. 154(b) by 410 days.

(21) Appl. No.: 12/436,966

(22) Filed: May 7, 2009

(65) Prior Publication Data

US 2010/0283540 A1    Nov. 11, 2010

(51) Int. Cl.
*H04B 1/04* (2006.01)

(52) U.S. Cl. ..................... 455/114.3; 330/149

(58) Field of Classification Search ........................ None
See application file for complete search history.

(56) References Cited

U.S. PATENT DOCUMENTS

| | | | | |
|---|---|---|---|---|
| 6,614,854 B1 * | 9/2003 | Chow et al. | .................... | 375/297 |
| 7,113,551 B2 * | 9/2006 | Sills et al. | .................... | 375/297 |
| 7,151,405 B2 * | 12/2006 | Nezami | .................... | 330/149 |
| 7,391,822 B2 * | 6/2008 | Song et al. | .................... | 375/297 |
| 7,514,996 B2 * | 4/2009 | Furuta et al. | .................... | 330/149 |
| 2003/0058959 A1 * | 3/2003 | Rafie et al. | .................... | 375/296 |
| 2005/0157814 A1 | 7/2005 | Cova | | |
| 2006/0232332 A1 | 10/2006 | Braithwaite | | |
| 2008/0130785 A1 * | 6/2008 | Reinhardt | .................... | 375/296 |

OTHER PUBLICATIONS

Search Report and Written Opinion in PCT/EP2010/056300, Sep. 9, 2010.

* cited by examiner

*Primary Examiner* — Cassandra Cox
(74) *Attorney, Agent, or Firm* — Barnes & Thornburg LLP

(57) ABSTRACT

Coefficients of a pre-distorter are determined for correction of distortion of a signal amplified by a radio frequency amplifier by sampling the signal at the input to the pre-distorter to generate a plurality of input samples and sampling the signal at the output of the amplifier to generate a plurality of output samples, each of the plurality of output samples corresponding to one of the plurality of input samples, calculating a figure of merit for one or more of said plurality of input samples on the basis of the one or more of said plurality of input samples, selectively updating a previously selected set of input samples with said one or more of said plurality of input samples on the basis of the calculated figure of merit, whereby to generate an updated selected set and determining the coefficients of the pre-distorter on the basis of the input samples in the updated selected set and the corresponding output samples.

13 Claims, 9 Drawing Sheets

PRE-DISTORTION FOR A RADIO FREQUENCY POWER AMPLIFIER

FIELD OF THE INVENTION

The present invention relates to pre-distortion for the correction of distortion introduced by a radio frequency amplifier to a signal, and in particular in a transmit chain for use in a multi-channel wireless transmitter.

BACKGROUND OF THE INVENTION

A power amplifier is a key component in a wireless transmitter; it is generally the last stage of amplification of a signal before transmission and accordingly it is required to handle potentially high powers, typically several Watts in a cellular wireless transmitter, for example. While other electronic components in a wireless transmit chain have been subject to integration with accompanying reductions in size and cost, the power amplifier has generally remained a bulky and relatively expensive component, due largely to its power dissipation and the need for cooling; it also requires a large and potentially costly power supply, which places heavy demands on battery back-up systems. As a result, there has been much effort directed at the development of more efficient power amplifier designs, aimed at reducing the power dissipation and the associated costs and environmental impact. Generally, efficiency in a power amplifier is achieved with the penalty of an inherently non-linear signal transfer characteristic, and furthermore the non-linearity may be a complex function involving temperature dependence and memory of preceding signal characteristics.

The non-linear characteristics of a power amplifier may be corrected by a pre-distorter, which is a circuit that is controlled in such a way that it introduces distortions to a signal, before it enters an amplifier, that are designed to counteract the effects of the non-linear transfer characteristic of the power amplifier, resulting ideally in an overall linear response for the transmit chain from the input to the pre-distorter to the output of the power amplifier. While it is also possible to introduce corrections to a signal after the power amplifier, it is generally preferable to introduce corrections before amplification, since this may be done at lower power and typically in the digital domain.

FIG. 1 shows a typical transmit chain having a pre-distorter, in a so-called error signal architecture. An input signal 2, typically at baseband, passes through pre-distorter 4 which introduces distortions to the signal, due to the transfer characteristic of the pre-distorter. Typically, the transfer characteristic may be defined by a polynomial, which may include delay terms, and may for example, be a Volterra series. The pre-distorter may be implemented as a finite impulse response digital filter, or alternatively as an infinite impulse response digital filter. It is convenient to implement the pre-distorter in the digital domain at baseband in inphase and quadrature components, but alternatively the pre-distorter may be implemented at an intermediate frequency or at radio frequency in analogue or digital domains. In the example of FIG. 1, an upconverter 6 is shown which mixes the signal up in frequency before amplification in the power amplifier, but it will be understood that this stage, and the corresponding downconverter 16, is optional, depending on the frequency plan.

Following the pre-distorter and upconverter, the signal is amplified by the power amplifier 8, operating typically at radio frequency. The output signal 10 from the power amplifier passes through a coupler 12 that passes most of the signal to the output of the transmit chain 14 and couples off a proportion of the signal for use in an observation receiver, comprising a downconverter 16 and a sampler 18, typically operating at baseband. Samples are also taken of the input signal by another sampler 20. The pre-distort trainer 22 takes input samples and corresponding samples from the observation receiver (downconverter 16 and sampler 18), that may be referred to as output samples, to control the coefficients of the pre-distorter.

FIG. 2 illustrates the operation of the pre-distort trainer 22 of FIG. 1. Input samples and corresponding output samples are aligned in phase by an aligner and comparator functional block 34 to compensate for the phase characteristics of circuit components and are compared, generating an error signal. The error signal is the difference between the output signal and the input signal, as represented by the samples, and the aligned input signal, used as a reference signal, as represented by input samples. Coefficients of a polynomial are trained in coefficient trainer 36 so that typically the reference, operated on by the polynomial, produces an output that would cancel the error signal. The coefficients generated by this process constitute the update coefficients for the pre-distorter, that is to say incremental updates of the coefficients applied by the pre-distorter. The pre-distorter update coefficients are held in a store 38 for use in updating the coefficients applied by the pre-distorter. In a variation of this scheme, the error signal may be generated in the analogue domain before sampling by the observation receiver.

FIG. 3 illustrates an alternative architecture of a transmit chain incorporating a pre-distorter, referred to as a full signal architecture. The system of FIG. 3 differs from the error signal architecture of FIG. 1 in that samples are taken of the output of the pre-distorter, rather than the input signal, for use in the pre-distort trainer. Training of the pre-distorter coefficients is typically performed to produce the result that the sampled output signal of the pre-distorter, acted upon by the polynomial, reproduces the output signal of the amplifier. The coefficients of the polynomial are thus the inverse of the characteristic required of the pre-distorter to counteract the non-linearity. The coefficients to be applied by the pre-distorter can then be derived by an appropriate transformation applied to the trained coefficients. It can be seen that the architecture of FIG. 3 does not calculate an error signal, and trains the whole polynomial coefficients rather than an incremental update of the polynomial coefficients.

The architectures of both FIG. 1 and FIG. 3 are intended for situations in which signal conditions are relatively stable, such as would be expected when the input signal represents a single wireless channel. The frequency band amplified by the amplifier is expected to be fully occupied, or at least occupied by a consistent spectrum, and the amplitude of the signal to be transmitted is expected to be relatively stable over time. In particular, a single relatively static signal is expected, not frequency hopping or varying in amplitude.

However, if multiple channels are transmitted by the amplifier, for example where the channels implement different wireless standards, the assumptions of stability of the frequency and amplitude composition of the aggregate signals may not be valid. In these circumstances, the training of the coefficients may not be stable, and the trained coefficients may not be optimal if the aggregate signal characteristics of the signals in the multiple channels change.

The present invention addresses these disadvantages.

SUMMARY OF THE INVENTION

In accordance with a first aspect of the present invention, there is provided a method of determining coefficients of a pre-distorter for correction of distortion of a signal, the distortion being introduced by a radio frequency amplifier in a system comprising the pre-distorter, the amplifier, a first sampler for sampling the signal input to the amplifier, and a second sampler for sampling the signal when output from the amplifier, the method comprising:

using the first sampler to sample the signal, whereby to generate a plurality of input samples;

using the second sampler to sample a plurality of output samples, each of the plurality of output samples corresponding to one of the plurality of input samples;

calculating a figure of merit for one or more of said plurality of input samples on the basis of a frequency spectrum of the set comprising the one or more of said plurality of input samples and a previously selected set of input samples;

selectively updating the previously selected set of input samples with said one or more of said plurality of input samples on the basis of the calculated figure of merit, whereby to generate an updated selected set; and determining the coefficients of the pre-distorter on the basis of at least some of the input samples in the updated selected set and the corresponding output samples.

An advantage is that input samples can be selected for inclusion in the set in such a way that the set has desired spectral properties, such as good coverage of the frequency band of the amplifier. Determining the coefficients of the pre-distorter on the basis of a set of input samples selected in this way has the benefit that the coefficients of the pre-distorter are determined by taking into account the amplifier characteristics for the whole occupied frequency spectrum. For example, if a signal is frequency hopping across the band, it is possible to ensure that some input samples are taken when the signal is at each frequency in its hop sequence. This ensures that the pre-distorter coefficients are not determined on the basis of a set of input samples in which some parts of the frequency spectrum are not occupied, which could potentially be occupied.

Preferably, the set of input samples is selectively updated on the basis of a figure of merit calculated on the basis of a amplitude of one or more input samples. The advantage of this is that if the amplitude of the one or more samples is below a given threshold, it may be concluded that the input signal may not be sufficient to cause non-linear effects in the amplifier that are typical of normal operating powers, so that excluding the one or more input samples from the set used to update the coefficients of the pre-distorter prevents an update to correct for non-typical characteristics, that may have unwanted effects if the signal were at a higher power. That is to say, the coefficients of the pre-distorter may be determined on the basis of input samples selected to have characteristics suitable for the determination so that, for example, samples may be selected that are expected to be amplified by the radio frequency amplifier according to a non-linear characteristic of the amplifier.

Conveniently, the set of input samples is selectively updated on the basis of a figure of merit calculated on the basis of a time of sampling of the one or more input samples. The advantage of this is that update of coefficients can be avoided at times when the occupancy of the spectrum is known to be incomplete, for example when one signal channel is temporarily inactive or operating at low power. The time of sampling may be used to vary the calculation of the figure of merit as a function of frequency spectrum or amplitude.

Advantageously, the figure of merit is calculated on the basis of a comparison of the frequency spectrum of the set of samples comprising the one or more of said plurality of input samples and a previously selected set of input samples with the frequency spectrum of the previously selected set of samples. The advantage is that the set of samples may be selectively updated with samples that give a greater coverage of the frequency spectrum, so that the coefficients of the pre-distorter may be updated taking into account the amplifier characteristics for the whole occupied frequency spectrum.

The afore-mentioned functionality can be embodied as software, or computer-readable code, encoded on a computer readable medium for use in controlling the pre-distorter in the manner described above.

Preferably, the first sampler comprises a first sampling part for sampling the signal input to the pre-distorter and a second sampling part for sampling the signal when output from the pre-distorter, the method comprising:

using the first sampling part to sample the signal, whereby to generate a plurality of first input samples;

using the second sampling part to sample the signal, whereby to generate a plurality of further input samples, each of the plurality of further input samples corresponding to one of the plurality of first input samples;

calculating the figure of merit for one or more of said plurality of first input samples on the basis of a frequency spectrum of the set comprising the one or more of said plurality of first input samples and a previously selected set of first input samples;

selectively updating a previously selected set of first input samples with said one or more of said plurality of first input samples on the basis of the calculated figure of merit, whereby to generate an updated selected set; and determining the coefficients of the pre-distorter on the basis of said further input samples corresponding to the updated selected set of input samples and said output samples corresponding to the updated selected set of input samples.

In this way, the sampling of the signal that is input to the amplifier is carried out in two parts. The first sampling part samples the signal at the input to the pre-distorter, for use in calculating the figure of merit. Sampling before the signal is distorted by the pre-distorter has the advantage that the figure of merit may be calculated before the amplitude and frequency characteristics of the signal are changed by the pre-distorter, enabling a reliable calculation of the figure of merit. The second sampling part samples the signal at the output of the pre-distorter for use in determining the coefficients of the pre-distorter. The advantage of this approach is that samples taken during a previous training process may be re-used for training a next set of coefficients, even if a different set of coefficients was applied by the pre-distorter during the previous training process. This is because the whole of each polynomial coefficient is trained rather than an incremental update part of each polynomial coefficient.

DETAILED DESCRIPTION OF THE INVENTION

In general, the present invention is directed to methods and apparatus for determining coefficients of a pre-distorter for correction of distortion of a signal, the distortion being introduced by a radio frequency amplifier.

By way of example an embodiment of the invention will now be described in the context of a multi-channel transmit chain of the base station of a cellular wireless system.

Power amplifiers specifically intended for second generation cellular wireless systems, such as GSM, typically do not employ pre-distortion, since the modulation format employed is relatively robust to distortion. Pre-distortion has previously been used for single or multichannel CDMA or UMTS systems, and for wideband systems using Orthogonal Frequency Division Modulation, such as Wimax and LTE. With increasing demands for capacity, and increasing bandwidths available from power amplifiers, it is becoming desirable to use multiple Wimax or LTE channels per power amplifier. Also, for a base station designed to operate next generation systems alongside legacy systems, it is economically attractive to share a power amplifier between systems operating on different standards. For example, an amplifier may be required to handle one or more of LTE, WiMax, CDMA, GSM, EDGE and UMTS standards.

As has already been mentioned, existing pre-distortion systems are intended for situations in which signal conditions are relatively stable, and if the requirements for frequency and amplitude stability are not satisfied, then the training of the coefficients may not be stable, and the trained coefficients may not be optimal.

A particularly troublesome situation arises in the case of an amplifier carrying combined LTE and GSM signals, where the GSM signal employs power profiling and frequency hopping. At any one time, the hopping signal will occupy a small part of the spectrum with the remainder of the potential hop positions unoccupied.

Figure 4:
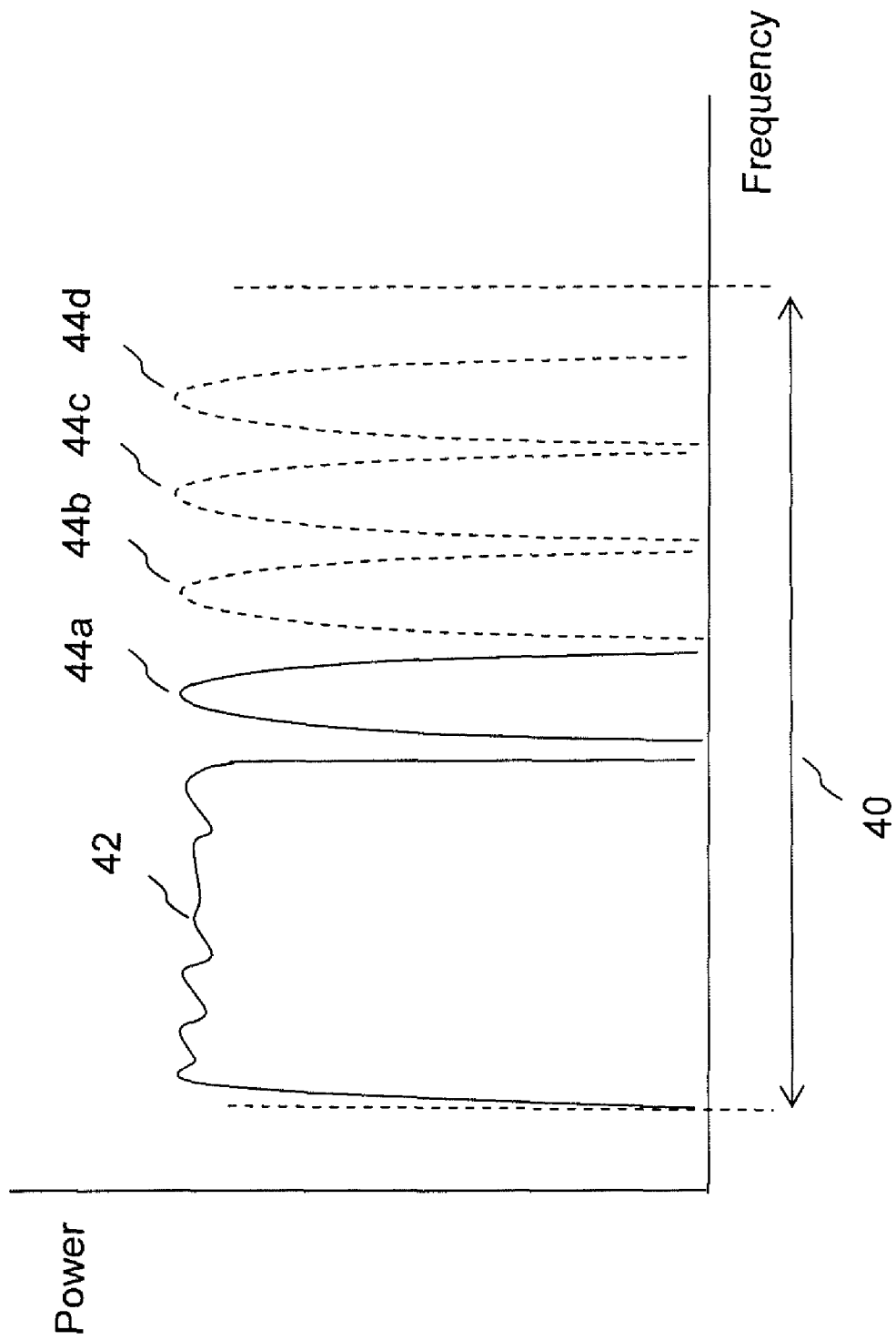
FIG. 4 is a schematic diagram showing the occupancy of the frequency band of the amplifier by multiple channels as an illustration of the operation of an embodiment of the invention.

FIG. 4 illustrates, in schematic form, the spectrum occupancy of an amplifier pass band 40 carrying an LTE channel 42 and a frequency hopping GSM signal 44a, 44b, 44c, 44d (not to scale). The solid line 44a illustrates the current hop location in frequency, and the dashed lines 44b, 44c, 44d illustrates other potential frequencies to which the GSM signal may hop.

Figure 1:
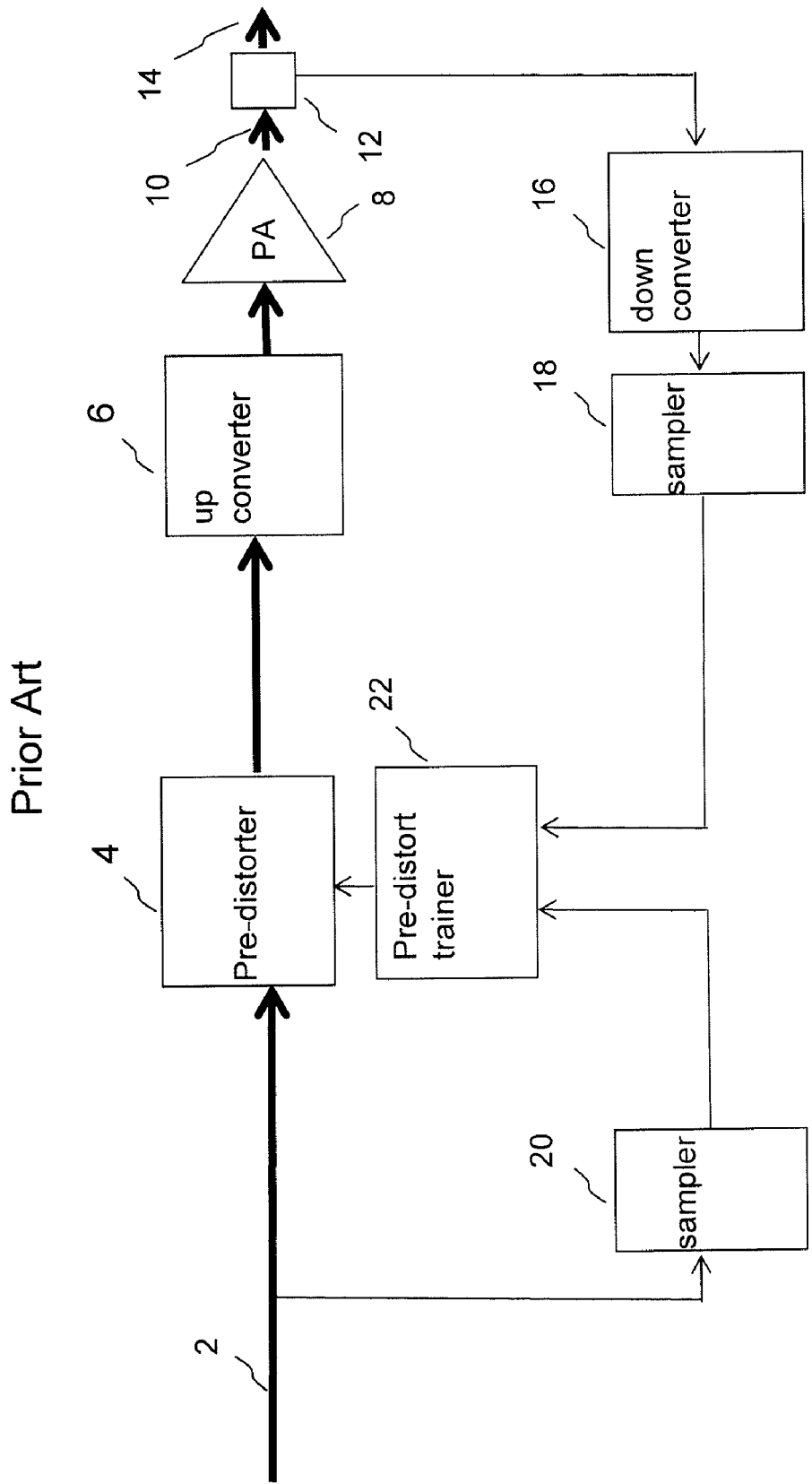
FIG. 1 is a schematic diagram showing a transmit chain incorporating a pre-distorter in a conventional error signal architecture.
Figure 5:
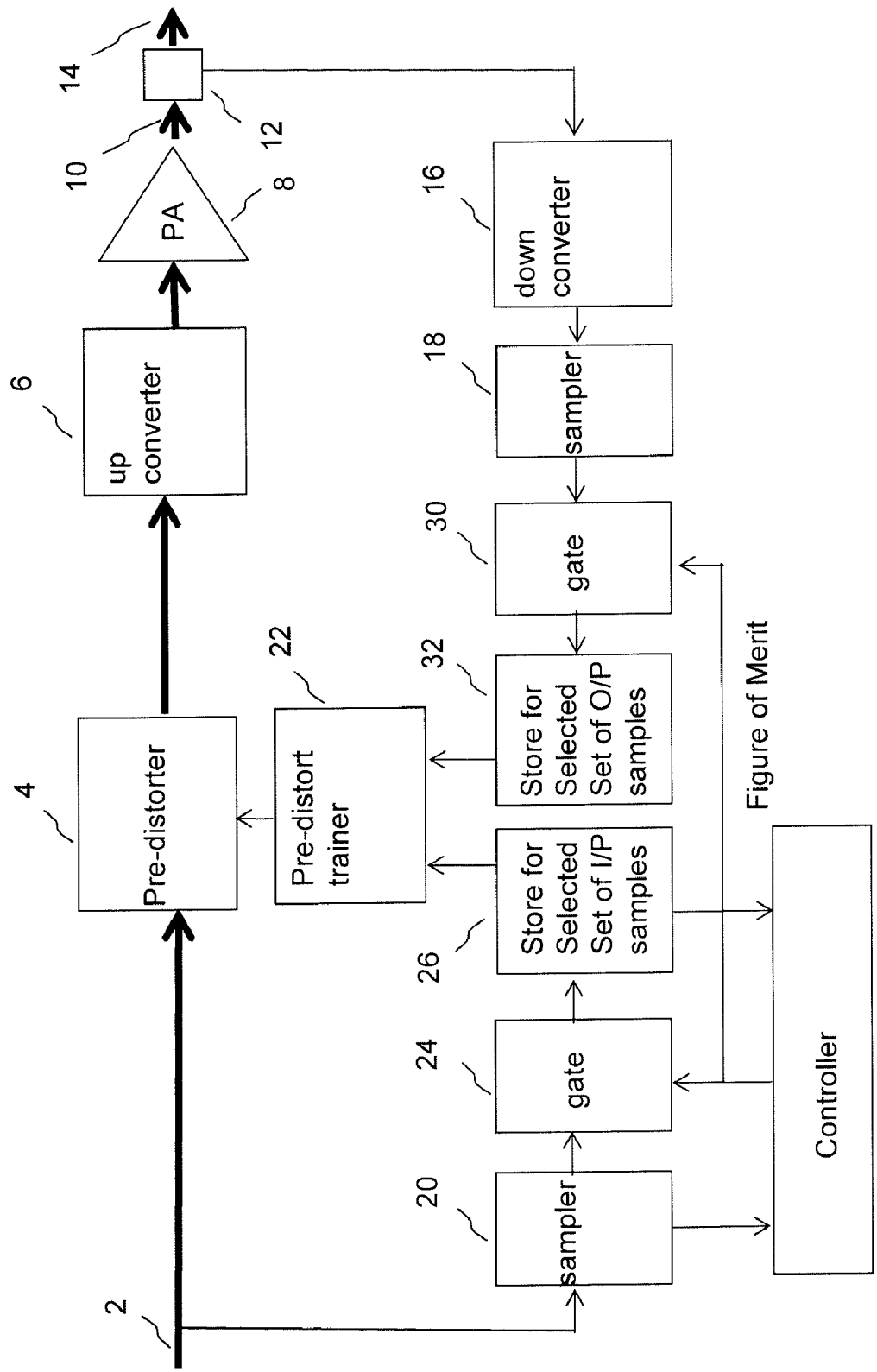
FIG. 5 is a schematic diagram showing a transmit chain according to an embodiment of the invention.

FIG. 5 illustrates an embodiment of the invention for use in situations in which signal stability cannot be relied upon, such as the situation illustrated by FIG. 4. The architecture of FIG. 5 is an error signal architecture similar to that of FIG. 1. The operation of the architecture of FIG. 5 can be described as follows. A signal 2, that may be a multi-channel and/or multi-standard signal is applied to the input of the transmit chain at the input of the pre-distorter 4. The input signal 2 may be in analogue or digital form, typically at baseband in inphase and quadrature format. Part of the input signal is sampled by the sampler 20 to form one or more input samples. If the signal is input in analogue form, the sampler converts samples of the signal into digital form, but if the signal is input in digital form, the sampler simply selects an existing one or more samples, or may interpolate between samples.

The signal 2 applied to the pre-distorter passes through the pre-distorter 4, and is modified by the transfer characteristic of the pre-distorter that is typically defined according to coefficients of a polynomial. Alternatively, the pre-distorter may be implemented by a look up table; the look up table values, also known as coefficients, are controlled by the pre-distort trainer 22 similarly to the coefficients of the polynomial. Either a polynomial or a look up table may be implemented in the pre-distorter in any of the embodiments of the invention disclosed in this application.

Following the pre-distorter 4, the distorted signal is optionally upconverted in the upconverter 6, typically to radio frequency, for amplification in the power amplifier 8. Typically most of the signal power passes from the output 10 of the power amplifier and passes through a coupler 12 to the output 14, and typically a lower power portion of the signal is coupled by the coupler. This is then passed to the optional downconverter 16 and is sampled by sampler 18 to produce one or more output samples.

The one or more input samples are used to from a set of input samples that includes the one or more input samples and a previously selected set of input samples. A figure of merit is calculated on the basis of the set by a controller 28. That is to say that an input sample, or for example a block of input samples, is added to a previously selected set of input samples that may be arbitrarily selected as a seed, and a figure of merit is calculated. If the figure of merit is better than the figure of merit for the previously selected set of samples, then the new sample or block of samples is added via the gate 24 to the set by the controller 28. The selected set of input samples is held in a store 26.

The figure of merit may be calculated to be representative of the suitability of the set of samples for determination of the coefficients of the pre-distorter. For example, the figure of merit may be calculated on the basis of the frequency spectrum of the set. Alternatively, or additionally, the figure of merit may be calculated on the basis of an amplitude characteristic of the one or more input samples, such as the peak or mean amplitude, to be used as an indication of the suitability of the one or more input samples for inclusion in the selected set. The controller may comprise a processor for calculating a Fast Fourier Transform of the set of samples for calculating the frequency spectrum of the set, and may comprise a processor for amplitude detection or peak detection of one or more samples or for the calculation of a mean amplitude of the one or more samples.

The inclusion of the one or more input samples into the selected set of input samples is controlled by the gate 24. Similarly, the inclusion of the one or more output samples into the selected set of output samples is controlled by the gate 30. The gates 24, 30 are controlled on the basis of the figure of merit.

Figure 2:
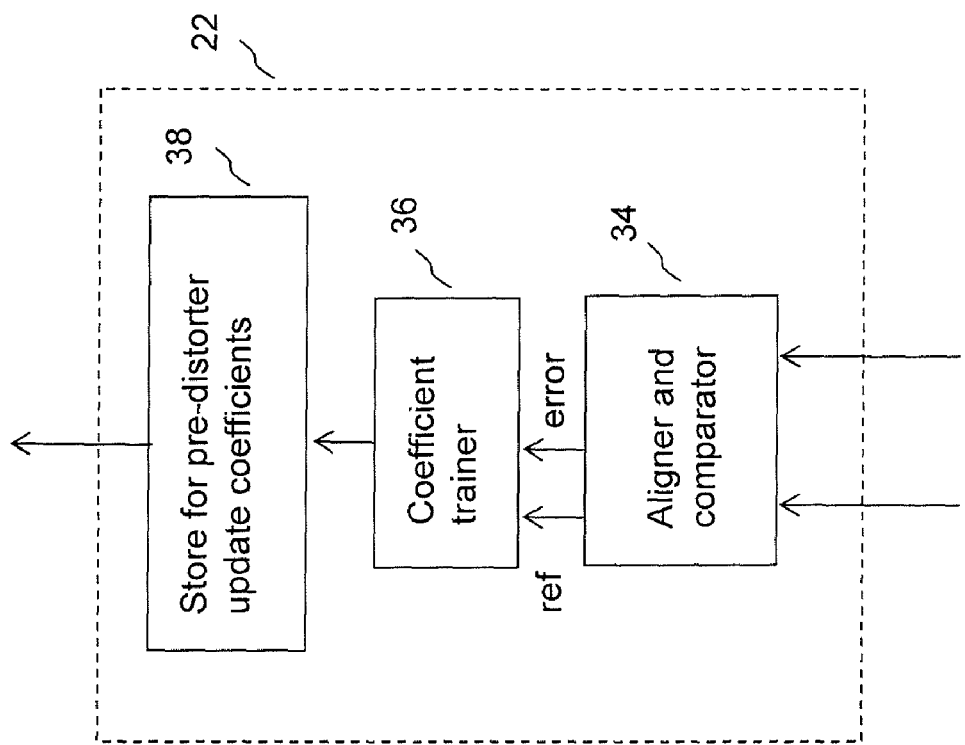
FIG. 2 is a schematic diagram showing a conventional pre-distort trainer of the architecture of FIG. 1.

Once an updated selected set of input samples has been selected, it is used together with the corresponding set of output samples to train the coefficients of the pre-distorter 4. The pre-distorter trainer 22 operates to train a set of pre-distorter update coefficients, as already described with reference to FIG. 2. The pre-distorter update coefficients are used to update the coefficients of the pre-distorter, for example by linear combination with the existing set of coefficients.

In this manner, the pre-distorter is controlled so as to minimise the distortion of the signal that is input at the input 2 to the transmit chain when it is output from the output 14 of the transmit chain.

Figure 6:
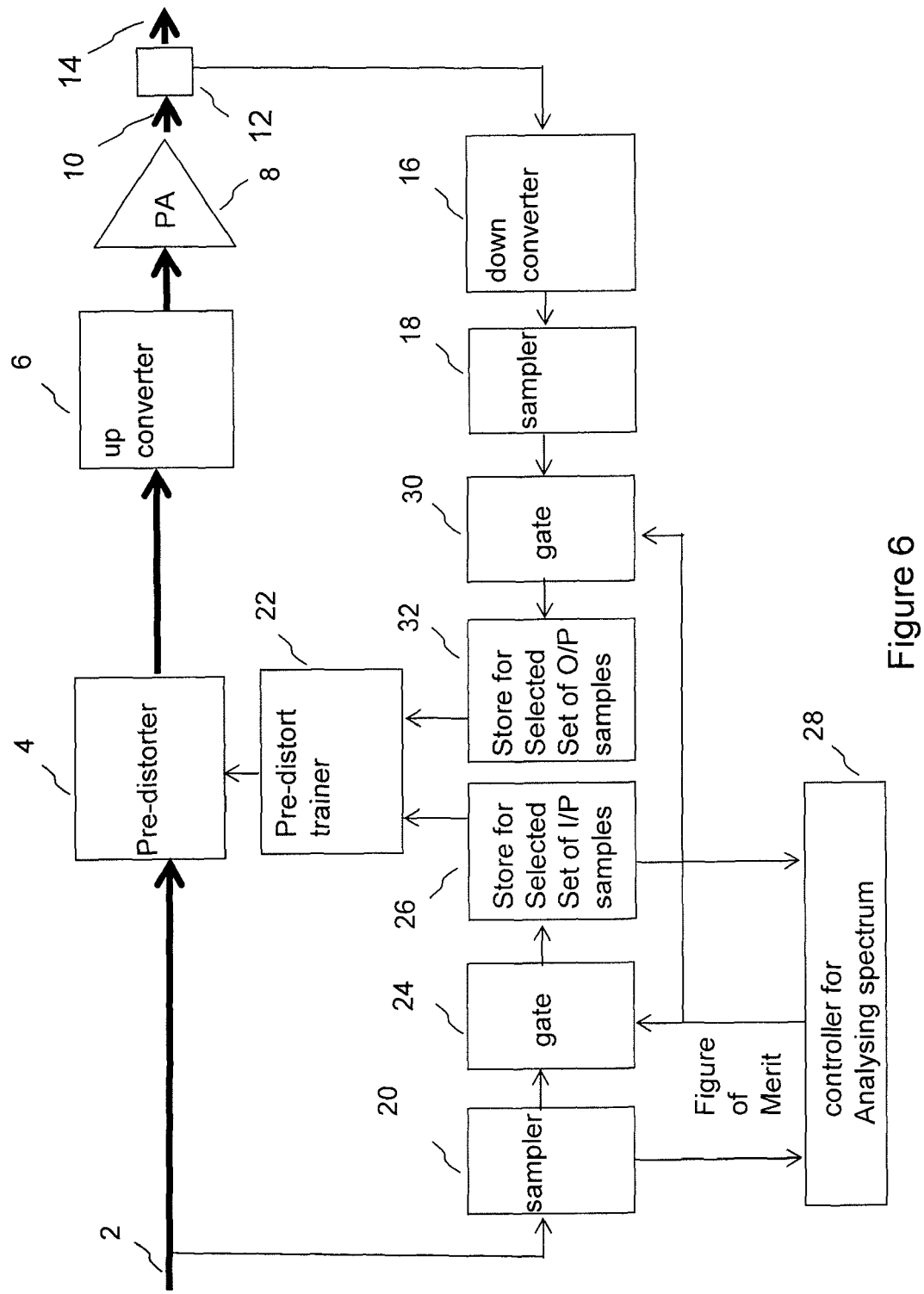
FIG. 6 is a schematic diagram showing a transmit chain incorporating spectrum analysis according to an embodiment of the invention.

FIG. 6 shows explicitly a spectrum analysis function operating on a set of input samples including both the one or more input samples and the previously selected set of input samples to generate the figure of merit.

The figure of merit may represent the frequency occupancy of the amplifier pass band, so that if a higher percentage of the band is occupied, the figure of merit is higher. The figure of merit may be a measure of gain flatness, that is to say the variation in amplitude of spectral components. For example, the spectral components may be represented by the frequency bins of a transform, such as a discrete Fourier transform or a Fast Fourier Transform (FFT). A flatter spectrum would result in a higher figure of merit, since it indicates a more fully occupied frequency band.

The resolution of the spectrum analysis should preferably be at least consistent with the expected bandwidth of spectral components that are expected to occupy the band temporarily. For example, for an 80 MHz input signal bandwidth, i.e. an expected amplifier occupied bandwidth of 80 MHz, it may be appropriate to analyse the frequency composition of the spectrum using a 512 point FFT with a resolution of approximately 160 kHz, the resolution being slightly less than the GSM signal bandwidth and channel spacing.

Figure 7:
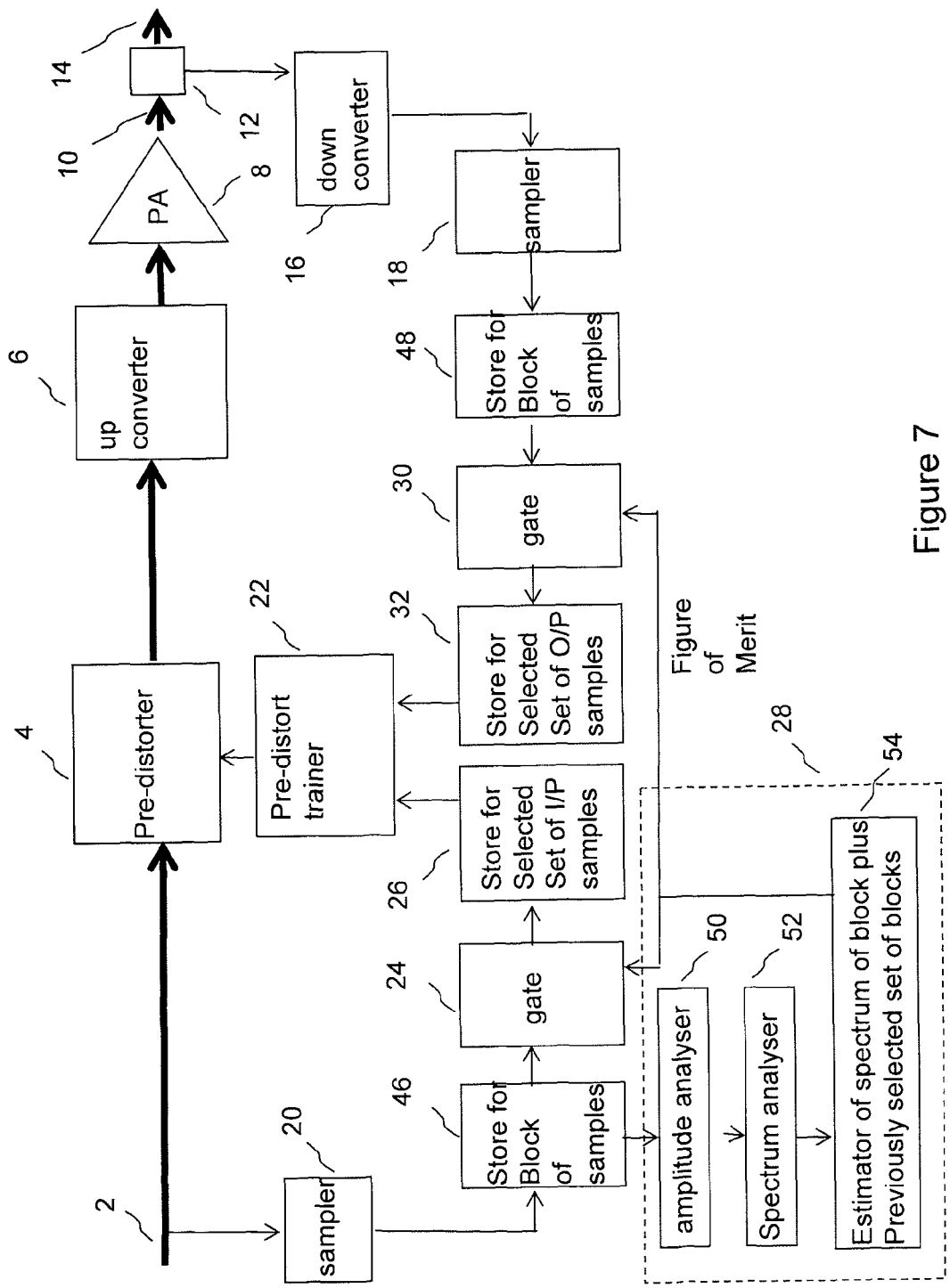
FIG. 7 is a schematic diagram showing a transmit chain selectively updating a set of samples with blocks of samples according to an embodiment of the invention.

FIG. 7 shows an implementation of the calculation of the figure of merit, on the basis of a series of blocks of input samples. The controller 28 calculates the figure of merit on the basis of a block of samples and previously selected blocks of samples. A block of samples is a set of samples that is typically taken over a continuous period of time. Conveniently a block of samples may comprise 4 k (4096) samples. It may also be convenient for a block of samples to comprise 32 k samples, but a block may comprise greater or lesser numbers of samples to suit the design of a particular system. In this embodiment a block of samples is analysed by amplitude analyser 50 according to its amplitude, that is to say magnitude, content. The analysis may be on the basis of the peak or mean amplitude, to determine whether or not the block of samples is suitable to exercise the dynamic range of the power amplitude sufficiently to generate significant non-linear components.

If the amplitude content is deemed suitable, the block of input samples is analysed by spectrum analyser 52 in terms of its spectral content. The analysis may be by an FFT of the block of input samples. An estimate is made by an estimator 54 of the combined spectrum of previously selected blocks of data, for example by using the FFT calculated for each selected block of input data, by setting the value of the level in each FFT frequency bin representing the combined spectrum to the highest of any of the corresponding bins in any of the FFTs for the previously selected blocks of data. The spectrum of the combined spectrum of the block of data with the previously selected blocks of data is then calculated by a similar technique, replacing the value of the level in an FFT bin representing the combined spectrum with the value in the corresponding bin representing the spectrum of the block of data, if that value is higher. The figure of merit for a block of data, which is used to decide whether or not to add the block to the set of previously selected blocks of data, is dependent on whether or not the addition of the FFT frequency bin values from the block of data improved the frequency coverage of the band or the gain flatness of the band. Frequency coverage may be calculated according to the percentage of a band which is greater than a given threshold value, where the threshold value may be expressed in relation to the peak or mean frequency component.

The figure of merit is used, as in the system of FIG. 6, to gate the entry of the block of input samples into the selected set of input samples used to update the coefficients of the pre-distorter, and to similarly gate the entry of the corresponding block of output samples, held in store 48, into the selected set of output samples 32. The selected set of input samples are held in a store 26 and the corresponding selected set of output samples are held in a store 32.

In a variant of the above method of selecting sets of blocks of samples, the number of selected blocks is limited, for example to 8 blocks. Each block that is a candidate for inclusion in the set is substituted for each of the previously selected blocks in turn, and the spectrum of each resulting combination is estimated. The set of selected blocks is updated to the best combination in terms of the properties of the frequency spectrum, such as gain flatness or proportion of the spectrum above a given level. The advantage of this is that the suitability of the set of blocks for determining the coefficients of the pre-distorter is maximised by the discarding less suitable blocks of samples.

Figure 8:
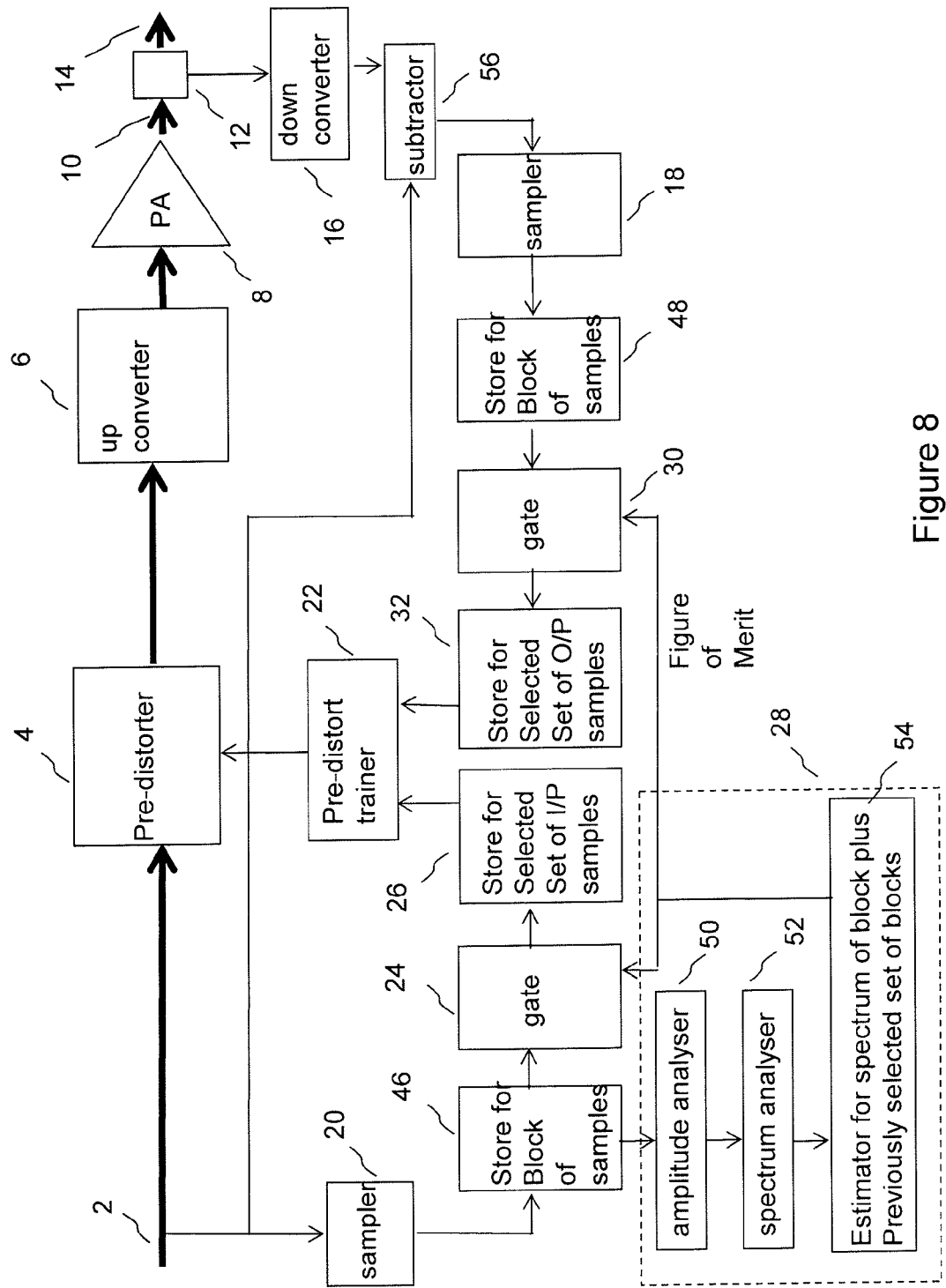
FIG. 8 is a schematic diagram showing a transmit chain having an architecture for generating an error signal by analogue subtraction according to an embodiment of the invention.

The architecture of FIG. 8 is a variant of that of FIG. 7, showing a subtraction by a subtractor 56, typically analogue, to generate an error signal representing the difference between the input, i.e. reference, signal and the signal coupled from the output of the amplifier and downconverted. It will be appreciated that the operation of this variant is otherwise similar to other error signal architectures, such as that illustrated by FIG. 7. The selected set of output samples, held in store 32, represents samples of the error signal. Accordingly, there is no need to generate an error signal in the pre-distort trainer 22.

Figure 3:
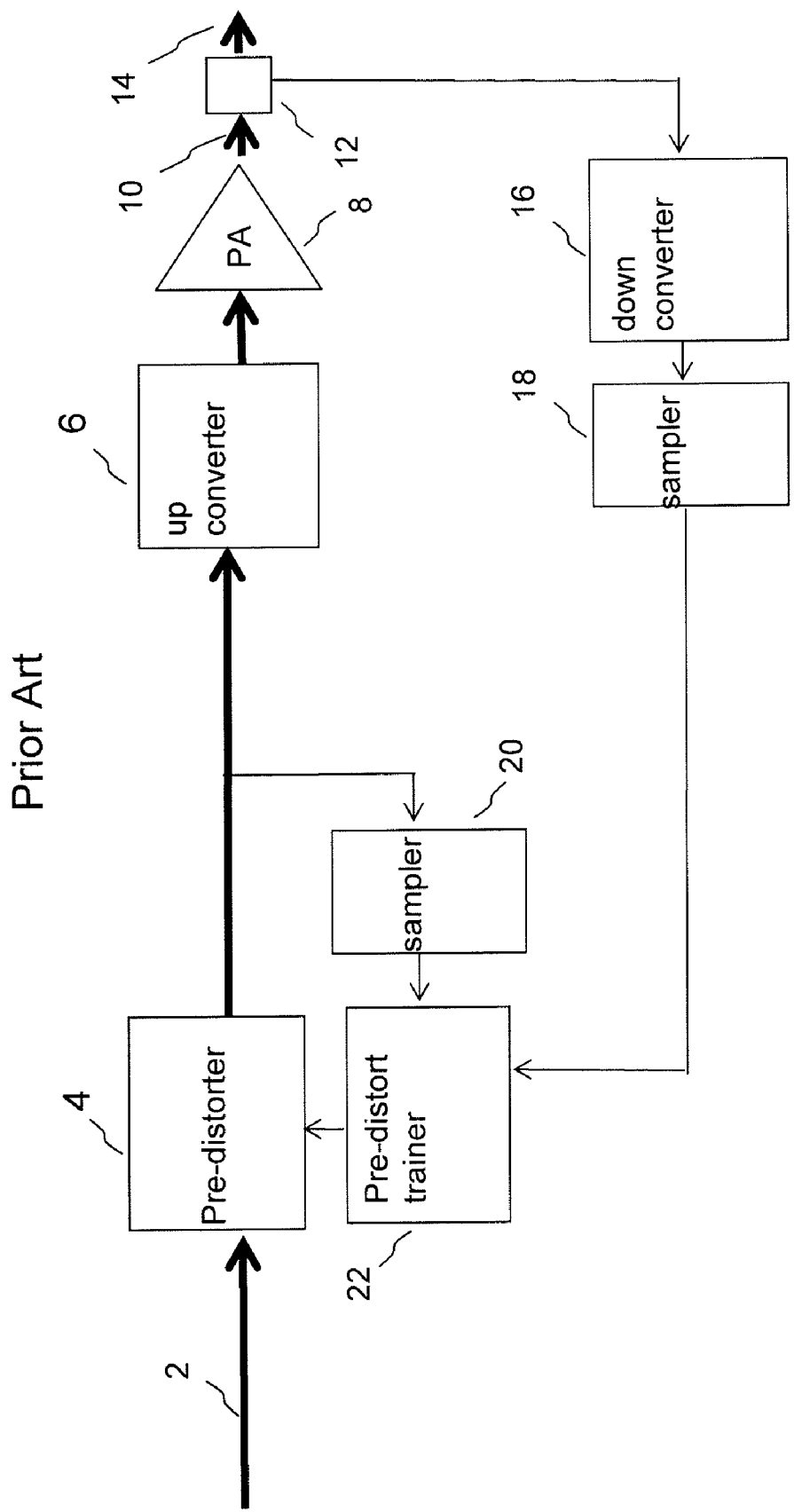
FIG. 3 is a schematic diagram showing a transmit chain incorporating a pre-distorter in a conventional full signal architecture.
Figure 9:
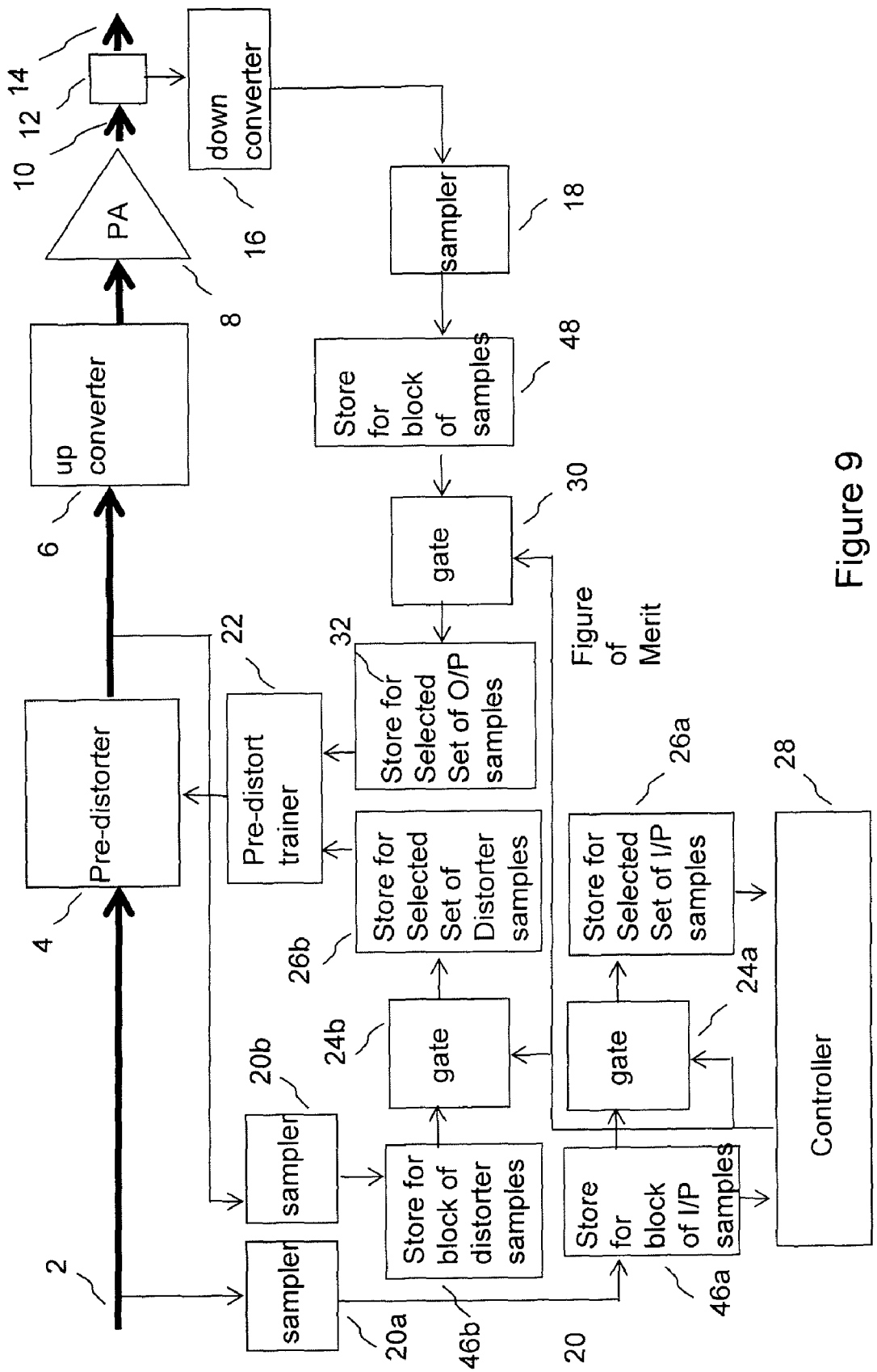
FIG. 9 is a schematic diagram showing a transmit chain having a full-signal architecture according to an embodiment of the invention.

FIG. 9 shows a full signal architecture according to a further embodiment of the invention. As for the architecture of FIG. 3, the pre-distorter coefficients are determined on the basis of samples of the signal that is input to the amplifier taken at the output of the pre-distorter 4 and samples taken after the output of the amplifier 8. However the figure of merit is calculated on the basis of samples taken of the input signal 2 taken at the input to the pre-distorter 4. This is because the amplitude and frequency content of the signal at the output of the pre-distorter 4 is distorted, and so does not give as reliable an indication of the suitability of samples for use in calculation of the pre-distorter coefficients as does the signal at the input. In this way, the sampling of the signal that is input to the amplifier 8 is carried out in two parts, the first sampling part sampling the signal that is transmitted by the transmit chain at the input to the predistorter 4, and the second sampling part sampling the signal at the output of the predistorter 4, that is to say before the amplifier 8.

As a variant, the figure of merit may be calculated on the basis of the samples taken of the signal at the output of the pre-distorter 4, since despite the distortion, the figure of merit calculated on this basis may be sufficiently reliable for the purposes of selecting samples. As a further variant, the figure of merit may be calculated on the basis of the samples taken of the signal at the output of the amplifier 8, since the figure of merit calculated on this basis may similarly be sufficiently reliable for the purposes of selecting samples. In this case, the frequency spectrum of a set of input samples is estimated from the frequency spectrum of the corresponding set of output samples. This may be appropriate when it is more convenient or more economical to use samples taken at points other than the input for calculation of the figure of merit.

It should be noted that, in any of the embodiments, it is not necessary that all samples in a selected set of samples are used in calculating the figure of merit. For example, a set of samples may comprise 32 k samples, but a subset of 512 samples only may be used as the input to a transform for the calculation of the figure of merit. Also, a set of samples may comprise samples taken of the signal at various points in the transmit chain, such as for example at the input, after the pre-distorter, or at the output of the amplifier, and the samples taken at all or a subset of these points may be used in the calculation of the figure of merit.

The architecture of FIG. 9 does not involve the calculation of an error signal, and the whole of each polynomial coefficient is trained rather than an incremental update part of each polynomial coefficient. An advantage of the architecture is that sets of samples taken in previous determinations of coefficients may be incorporated into current sets of samples. Particularly suitable sets samples, such as sets of input and output samples, can thus be saved for future use.

It should be noted that the method of calculation of the figure of merit as illustrated in FIG. 7, in particular the section within the dashed line referred to by reference numeral 28, may also be applied to the architecture of FIG. 9.

The above embodiments are to be understood as illustrative examples of the invention. It is to be understood that any feature described in relation to any one embodiment may be used alone, or in combination with other features described, and may also be used in combination with one or more features of any other of the embodiments, or any combination of any other of the embodiments. Furthermore, equivalents and modifications not described above may also be employed without departing from the scope of the invention, which is defined in the accompanying claims.

The invention claimed is:

1. A method of determining coefficients of a pre-distorter for correction of distortion of a signal, the distortion being introduced by a radio frequency amplifier in a system comprising the pre-distorter, the amplifier, a first sampler for sampling the signal input to the amplifier, and a second sampler for sampling the signal when output from the amplifier, the method comprising:
   using the first sampler to sample the signal, whereby to generate a plurality of input samples;
   using the second sampler to sample a plurality of output samples, each of the plurality of output samples corresponding to one of the plurality of input samples;
   calculating a figure of merit for one or more of said plurality of input samples on the basis of a comparison of a first frequency spectrum with a second frequency spectrum, the first frequency spectrum being a frequency spectrum of a set of input samples comprising the one or more of said plurality of input samples and a previously selected set of input samples;
   selectively updating the previously selected set of input samples with said one or more of said plurality of input samples on the basis of the calculated figure of merit, whereby to generate an updated selected set; and
   determining the coefficients of the pre-distorter on the basis of at least some of the input samples in the updated selected set and the corresponding output samples.

2. A method according to claim 1, wherein said calculating the figure of merit for said one or more of said plurality of input samples is on a basis further comprising an amplitude of said one or more of said plurality of input samples.

3. A method according to claim 1, wherein said calculating the figure of merit for said one or more of said plurality of input samples is on a basis further comprising a time of sampling of said one of said plurality of input samples.

4. A method according to claim 1, wherein the second frequency spectrum is a frequency spectrum of the previously selected set of input samples.

5. A method according to claim 1, wherein said comparison comprises a comparison of flatness of the first frequency spectrum with flatness of the second frequency spectrum.

6. A method according to claim 1, wherein the first sampler comprises a first sampling part for sampling the signal input to the pre-distorter and a second sampling part for sampling the signal when output from the pre-distorter, and wherein said plurality of input samples comprises a plurality of first input samples and a plurality of further input samples, the method comprising:
   using the first sampling part to sample the signal, whereby to generate said plurality of first input samples; and
   using the second sampling part to sample the signal, whereby to generate said plurality of further input samples, each of the plurality of further input samples corresponding to one of the plurality of first input samples,
   wherein said set of input samples having the first frequency spectrum is a set comprising one or more of said plurality of first input samples and a previously selected set of first input samples,
   and wherein said determining the coefficients of the pre-distorter is on the basis of one or more of said plurality of further input samples corresponding to the updated selected set of input samples and said output samples corresponding to the updated selected set of input samples.

7. A non-transitory computer readable medium encoded with computer readable code for causing a controller to perform the method of claim 1.

8. A transmit chain comprising a pre-distorter for correction of distortion of a signal using determined coefficients, the distortion being due to a radio frequency amplifier, the transmit chain further comprising:
   a first sampler arranged to sample the signal input to the amplifier, whereby to generate a plurality of input samples;
   a second sampler arranged to sample the signal when output from the amplifier, whereby to generate a plurality of output samples, each of the plurality of output samples corresponding to one of the plurality of input samples; and
   a controller arranged to calculate a figure of merit for one or more of said plurality of input samples on the basis of a comparison of a first frequency spectrum with a second frequency spectrum, the first frequency spectrum being a frequency spectrum of a set of input samples comprising the one or more of said plurality of input samples and a previously selected set of input samples,
   the controller further arranged to selectively update the previously selected set with said one or more of said plurality of input samples on the basis of the calculated figure of merit, whereby to generate an updated selected set, and the controller further arranged to determine the coefficients of the pre-distorter on the basis of at least some of the input samples in the updated selected set and the corresponding output samples.

9. A transmit chain according to claim 8, wherein the controller is arranged to calculate the figure of merit for said one or more of said plurality of input samples on a basis further comprising an amplitude of said one of said plurality of input samples.

10. A transmit chain according to claim 8, wherein the controller is arranged to calculate the figure of merit for said one or more of said plurality of input samples on a basis further comprising a time of sampling of said one of said plurality of input samples.

11. A transmit chain according to claim 8, wherein the second frequency spectrum is a frequency spectrum of the previously selected set of input samples.

12. A transmit chain according to claim 8, wherein said comparison comprises a comparison of flatness of the first frequency spectrum with the flatness of the second frequency spectrum.

13. A transmit chain according to claim 8, wherein said plurality of input samples comprises a plurality of first input samples and a plurality of further input samples, the first sampler comprising:
- a first sampling part for sampling the signal at the input to the pre-distorter whereby to generate said plurality of first input samples; and
- a second sampling part for sampling the signal at the output of the pre-distorter whereby to generate said plurality of further input samples, each of said plurality of further input samples corresponding to one of said plurality of first input samples,
- wherein said set of input samples having the first spectrum is a set comprising one or more of said plurality of first input samples and a previously selected set of first input samples, and
- wherein the controller is arranged to determine the coefficients of the pre-distorter on the basis of one or more of said plurality of further input samples corresponding to the updated selected set of input samples and said output samples corresponding to the updated selected set of input samples.

* * * * *